(12) United States Patent
Satoh et al.

(10) Patent No.: US 7,705,328 B2
(45) Date of Patent: Apr. 27, 2010

(54) BROAD RIBBON BEAM ION IMPLANTER ARCHITECTURE WITH HIGH MASS-ENERGY CAPABILITY

(75) Inventors: Shu Satoh, Byfield, MA (US); Manny Sieradzki, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 376 days.

(21) Appl. No.: 11/932,117

(22) Filed: Oct. 31, 2007

(65) Prior Publication Data

US 2009/0108198 A1 Apr. 30, 2009

(51) Int. Cl.
*G21K 5/10* (2006.01)
*H01J 37/08* (2006.01)

(52) U.S. Cl. ............................ 250/492.21; 250/396 R; 250/492.2; 250/492.3; 250/423 R; 250/427; 250/398; 250/396 ML

(58) Field of Classification Search ............ 250/492.21, 250/396 R, 492.2, 492.3, 423 R, 427, 398, 250/396 ML See application file for complete search history.

(56) References Cited

U.S. PATENT DOCUMENTS 5,126,575 A * 6/1992 White .................... 250/492.3
6,635,880 B1 * 10/2003 Renau .................. 250/396 ML
2006/0043316 A1 * 3/2006 Liebert et al. .......... 250/492.21

* cited by examiner

*Primary Examiner*—Nikita Wells
*Assistant Examiner*—Meenakshi S Sahu
(74) *Attorney, Agent, or Firm*—Eschweiler & Associates, LLC

(57) ABSTRACT

A ribbon ion beam system, comprising an ion source configured to generate a ribbon ion beam along a first beam path, wherein the ribbon ion beam enters a mass analysis magnet having a height dimension ($h_1$) and a long dimension ($w_1$) that is perpendicular to an xy plane, wherein the mass analysis magnet is configured with its momentum dispersive xy plane to receive the ribbon ion beam and to provide magnetic fields to transmit the ribbon ion beam along a second beam path, wherein the ribbon ion beam exiting the mass analysis magnet is divergent in the non-dispersive xz plane and convergent in the xy plane, a mass selection slit for receiving the divergent ribbon ion beam and selecting desired ion species of the ribbon ion beam exiting the mass analysis magnet, an angle correction device configured to receive the divergent ribbon ion beam exiting the mass selection slit into a parallel ribbon ion beam in the horizontal xz plane and a diverging ribbon ion beam in an xy plane along a third beam path, and wherein the parallel ribbon beam has a variable height ($h_2$) and a long dimension, width ($w_2$).

25 Claims, 8 Drawing Sheets

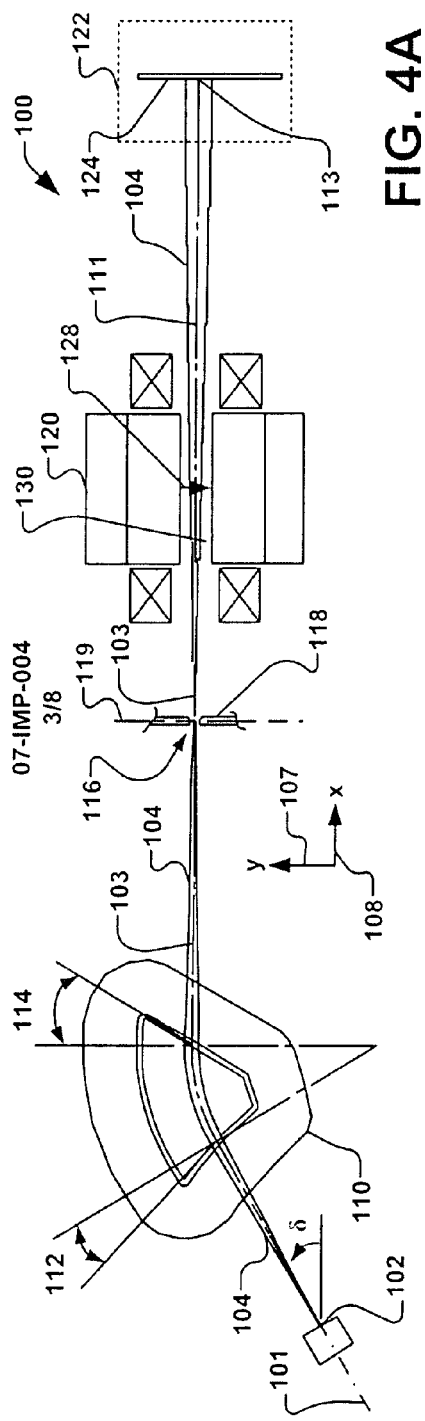
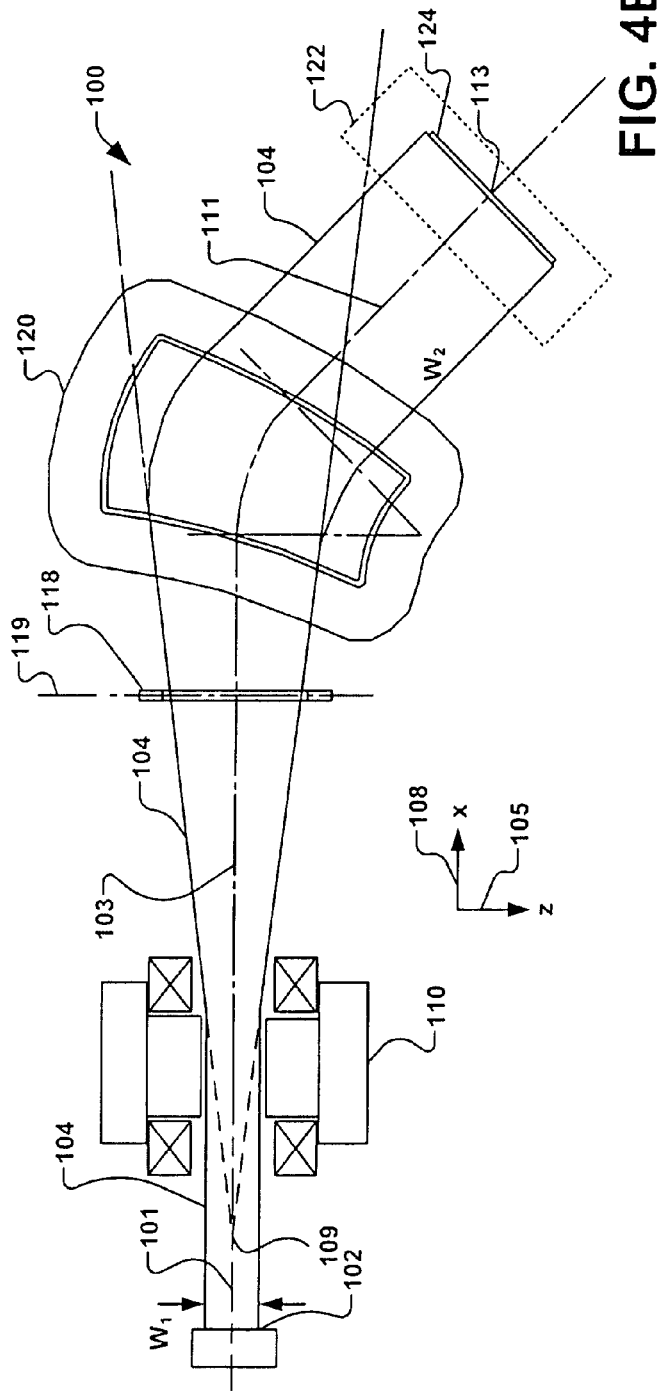

BROAD RIBBON BEAM ION IMPLANTER ARCHITECTURE WITH HIGH MASS-ENERGY CAPABILITY

FIELD OF THE INVENTION

The present invention relates generally to ion ribbon beam implantation systems and more particularly to an ion ribbon beam implantation system and method with high mass-energy capability.

BACKGROUND OF THE INVENTION

Ion implantation systems are used to dope semiconductors with impurities in integrated circuit manufacturing. In such systems, an ion source ionizes a desired dopant element, which is then extracted from the ion source in the form of an ion beam. The ion beam is typically mass analyzed to select ions of a desired charge-to-mass ratio and then directed at the surface of a semiconductor workpiece in order to implant the workpiece with the dopant element. The ions of the beam penetrate the surface of the workpiece to form a region of desired conductivity, such as in the fabrication of transistor devices in the workpiece. A typical ion implanter includes the ion source for generating the ion beam, a beamline assembly including the mass analysis apparatus for mass resolving the ion beam using magnetic fields, and a target chamber containing the semiconductor wafer or workpiece to be implanted by the ion beam. The ion beam implanter may include beam forming and shaping structures extending between the ion source and the implantation station. The beam forming and shaping structures maintain the ion beam and bound an elongated interior cavity or passageway through which the beam passes en route to the implantation station.

The mass of an ion relative to its charge thereon (e.g., charge-to-mass ratio) affects the degree to which it is accelerated both axially and transversely, by an electrostatic or magnetic field. Therefore, the beam which reaches a desired area of a semiconductor workpiece or other target can be made very pure since ions of undesirable molecular weight will be deflected to positions away from the beam and implantation of other than desired materials can be avoided. The process of selectively separating ions of desired and undesired charge-to-mass ratios is known as mass analysis mentioned supra. Mass analyzers typically employ a mass analysis magnet creating a dipole magnetic field to deflect various ions in an ion beam via magnetic deflection in an arcuate passageway.

In order to achieve a desired implantation for a given application, the dose and energy of the implanted ions may be varied. The ion dose controls the concentration of implanted ions for a given semiconductor material. Typically, high current implanters are used for high dose implants, while medium current implanters are used for lower dose applications. The ion energy is used to control junction depth in semiconductor devices, where the energy levels of the beam ions determine the degree to which ions are implanted or the depth of the implanted ions within the semiconductor or other substrate material. The continuing trend toward smaller semiconductor devices requires a mechanism that serves to deliver high beam currents at low energies. The high beam currents provide the necessary dose levels, while the low energy currents permit shallow implants.

In most prior art systems, the ion implantation employed is a pencil-type ion beam, wherein a relatively narrow beam is produced by the ion source and subjected to mass analysis, subsequent beam conditioning, and scanning before reaching the workpiece. In this case, the reduced energies of the ions cause some difficulties in maintaining convergence of the ion beam due to the mutual repulsion of ions bearing a like charge. High current ion beams typically include a high concentration of similarly charged ions that tend to diverge due to mutual repulsion. One solution to the above problem is to employ a ribbon-type ion beam instead of a pencil-type beam. One advantage of the ribbon-type beam is that the cross-sectional area of the beam is substantially larger than the pencil-type beam. For example, a typical pencil beam has a diameter of about 1-5 cm, wherein a ribbon-type beam may have a height of about 1-5 cm and a width of about 40 cm. With the substantially larger beam area, a given beam current has substantially less current density, and the beam has a lower perveance. Use of a ribbon-type beam, however, has a number of unique challenges associated therewith.

Typical ribbon ion beam systems often have difficulty in preventing tight beam spots within the system which forces the space charge expansion of the ion beam to remain low. For example, referring to FIGS. 1 and 2 is a prior art approach from U.S. Pat. No. 5,126,575 for Method and Apparatus for Broad Beam Ion Implantation issued to Nicholas R. White. It is apparent in FIGS. 1 and 2 that the ion beam 1 has a tight beam spot located within the analyzing magnet 3 at a vertical focal point 12. (See also e.g., Col. 4, lines 4-18). The "tightness" of the beam 1 at the focal point 12 allows the substantial loss of beam quality in a low energy beam due to space charge expansion which will result in poor beam transmission. In addition, referring to FIG. 3 is a prior art approach illustrated in U.S. Pat. No. 6,635,880 for High Transmission, Low Energy Beamline Architecture for Ion Implanter issued to Anthony Renau. In that prior art approach the ion beam 12 has a tight beam spot at the ion source 10 exit, for example. That prior art approach is known to have limitations in providing high current, low energy ion beams.

Therefore, in ribbon ion beam implantation systems, there remains a need for a ribbon ion beam implantation system that provides high beam currents at low energies.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In accordance with one aspect of the present invention, a ribbon ion beam system, comprising an ion source configured to generate a ribbon ion beam along a first beam path, wherein the ribbon ion beam enters a mass analysis magnet having a height dimension ($h_1$) and a long dimension ($w_1$) that is perpendicular to an xy plane, wherein the mass analysis magnet is configured with its momentum dispersive xy plane to receive the ribbon ion beam and to provide magnetic fields to transmit the ribbon ion beam along a second beam path, wherein the ribbon ion beam exiting the mass analysis magnet is divergent in a non-dispersive xz plane and convergent in the xy plane, a mass selection slit for receiving the divergent ribbon ion beam and selecting desired ion species of the ribbon ion beam exiting the mass analysis magnet, an angle correction device configured to receive the divergent ribbon ion beam exiting the mass selection slit into a parallel ribbon ion beam in the horizontal xz plane and a diverging ribbon ion beam in an xz plane along a third beam path, and wherein the parallel ribbon beam has a variable height ($h_2$) and a long dimension, width ($w_2$).

In another aspect of the invention, a method of producing a ribbon ion beam, comprising generating the ribbon ion beam utilizing an ion source, wherein the ribbon ion beam is directed along a first beam path, receiving the ribbon ion beam having a beam cross-section with a height dimension ($h_1$) and with a long dimension ($w_1$) that is perpendicular to an xy plane, at an entrance shim angle of the mass analysis magnet, transmitting the ribbon ion beam at an exit shim angle along a second beam path wherein the ribbon ion beam exiting the mass analysis magnet is dispersing in an xz plane and converging in the xy plane, selecting desired ion species of the ribbon ion beam exiting the mass analysis magnet utilizing a mass selection slit, and converting the ribbon ion beam exiting the mass selection slit into a parallel ribbon ion beam in the xz plane and a diverging ribbon ion beam in an xy plane along a third axis utilizing an angle correction device and wherein the parallel ribbon ion beam has a height ($h_2$) and a long dimension, width ($w_2$).

In yet another aspect of the present invention, a ribbon ion beam implant system for controllably treating a workpiece comprising: (a) source means for generating a ribbon ion beam directed along a first beam path, (b) mass analysis means to mass analyze the ribbon ion beam entering the mass analysis magnet having a cross section with a variable height dimension ($h_1$) and with a long dimension ($w_1$) that is constant and perpendicular to an xy plane, (c) receiving means for receiving the ribbon ion beam at an entrance shim angle, (d) transmitting means for transmitting the diverging ribbon ion beam along the xz plane at an exit shim angle and a second beam path, (e) selecting means for choosing desired ion species of the diverging ribbon ion beam along the xz plane utilizing a mass selection slit, and (f) converting means for changing diverging ribbon ion beam along the xz plane into a parallel ribbon beam along the xz plane traveling along a third beam path utilizing an angle correction device.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 4A is a side view illustrating components of an exemplary ribbon ion beam implantation system in accordance with one or more aspects of the present invention;

FIG. 4B is a top view of the exemplary ribbon ion beam implantation system illustrated in FIG. 4A in which various aspects of the invention may be carried out;

DETAILED DESCRIPTION OF THE INVENTION

Figure 1:
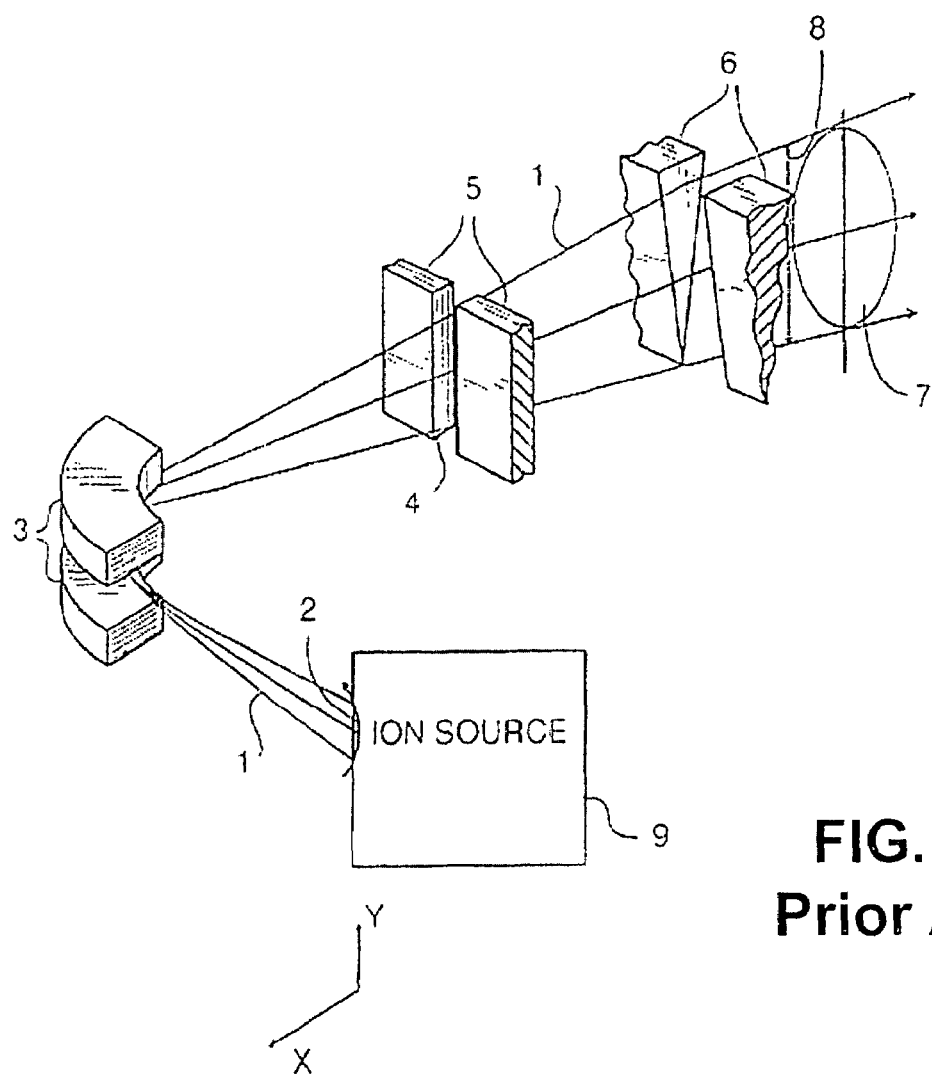
FIG. 1 illustrates a prior art isometric view of an ion ribbon beam implantation system.
Figure 2:
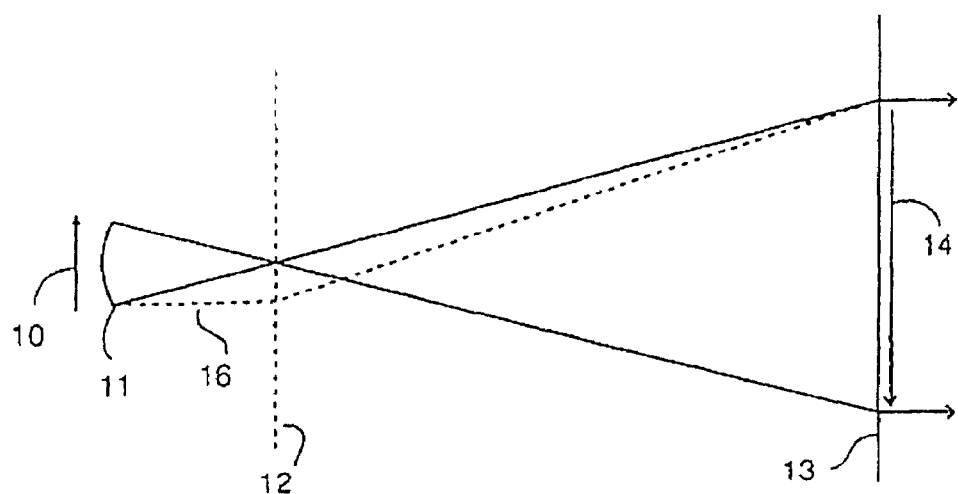
FIG. 2 illustrates how the prior art ribbon ion beam system shown in FIG. 2 functions in the vertical (non-dispersive) plane.

The present invention will now be described with reference to the drawings wherein like reference numerals are used to refer to like elements throughout. The illustrations and following descriptions are exemplary in nature, and should not be considered limiting. Thus, it will be appreciated that variants of the illustrated systems and methods and other such implementations apart from those illustrated herein are deemed as falling within the scope of the present invention and the appended claims.

Figure 4C:
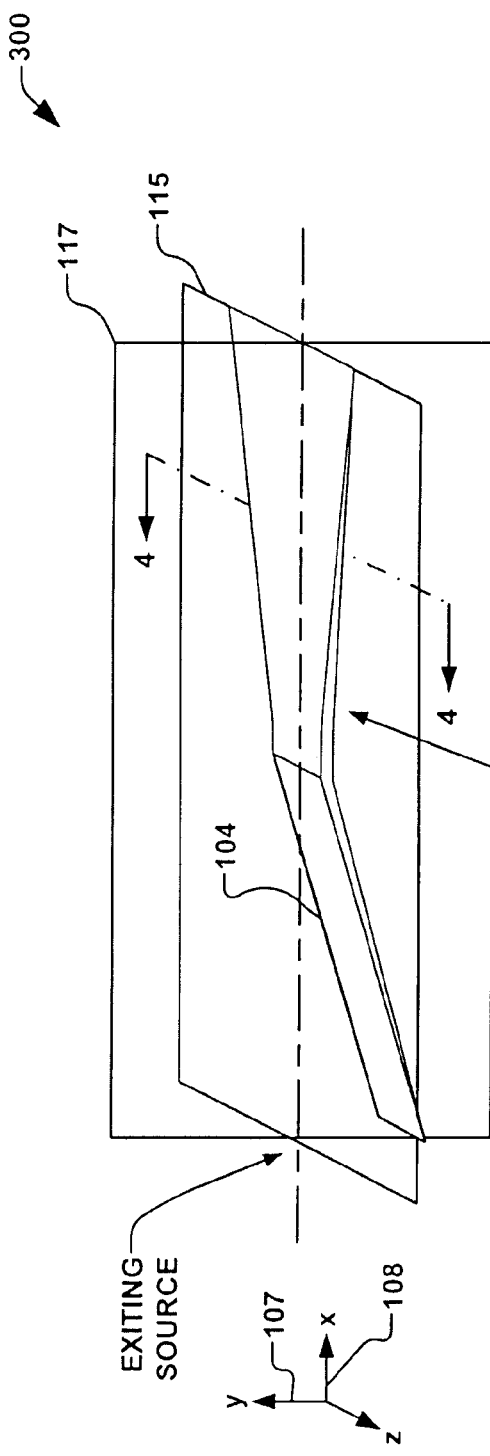
FIG. 4C is a side perspective view of an exemplary ribbon ion beam in which various aspects of the invention may be carried out.

Referring initially to FIGS. 4A, 4B, 4C and 4D, a ribbon ion beam system 100 suitable for implementing one or more aspects of the present invention is depicted in a simplified schematic side view illustration in FIG. 4A and a simplified top view in FIG. 4B. Various ion planes are illustrated in detail, in FIGS. 5-6.

The system 100 illustrated in FIG. 4A includes an ion source 102 for producing a ribbon ion beam 104 (See e.g., FIGS. 4C and 4D, 5 and 6). The ion beam source 102 includes, for example, a plasma source (not shown) with an associated power source (not shown). The plasma source may, for example, comprise a plasma confinement chamber from which an ion beam 104 is extracted. Unlike other schemes for ribbon beam production, this invention does not require that the ion beam 104 to be divergent or convergent out of the ion source 102 in the xz plane 115 (FIG. 4C). The ribbon ion beam 104 exiting the ion source 102 has a rectangular cross section with a height (h0) and a long dimension, width (w0), typically about 100 mm wide. A mass analysis magnet 110 is provided downstream of the ion source 102 to receive the ribbon ion beam 104 therefrom. Since the initial width (w0) of the ribbon ion beam 104 is about 100 mm, substantially smaller than its final width ($w_2$), of approximately 400 mm, a gap of the mass analysis magnet 110 does not have to be excessively large and therefore can be constructed to have a high mass energy product, for example, enough to bend 80 KeV ions. This is a high mass energy product similar to the mass energy products traditional implanters now provide. The high mass energy product of the magnet 110 allows a tight bending radius of the ribbon ion beam 104, for example, 30 cm. This allows better low energy beam transmission through the magnet 110 because of the short beam path length in the magnetic field in which beam neutralization is known to be not completely satisfied and therefore beam space charge expansion can take place. The high mass energy product can also reduce large power consumption which large gap analyzer magnets typically require. The strength of this dipole magnetic field is controlled by control electronics which adjusts the electrical current through the field windings of the magnet 110.

The ribbon ion beam 104 exiting the mass analysis magnet 110 is slightly converging in the vertical y direction 107 in the xy plane 117 (See e.g., FIG. 4C) to form a cross over 116 at a large distance downstream from the mass analysis magnet 110, where a mass selection slit 118 is located. Ions having different masses in the initial ion beam 104 out of the ion source 102 get bent differently by the mass analysis magnet 110 and arrive at the mass selection slit 118 at different vertical locations. By adjusting the magnetic field of the mass analysis magnet 110, only the desired ions pass through the mass selection slit 118 to go further on to an angle correction device 120. This slight vertical convergence of the ribbon ion beam 104 can help to maintain a small beam height when passing through the angle correction device 120 and when impacting a workpiece 124. As discussed supra, the inventors recognized that by having the ribbon ion beam 104 come out of the ion source 102 in an approximately parallel manner that this offered a great advantage in keeping space charge expansion low. This approach prevents a tight beam spot from appearing anywhere in the ion implantation system 100 allowing the extraction and implantation of a large quantity of low energy beam ions, for example.

Figure 4D:
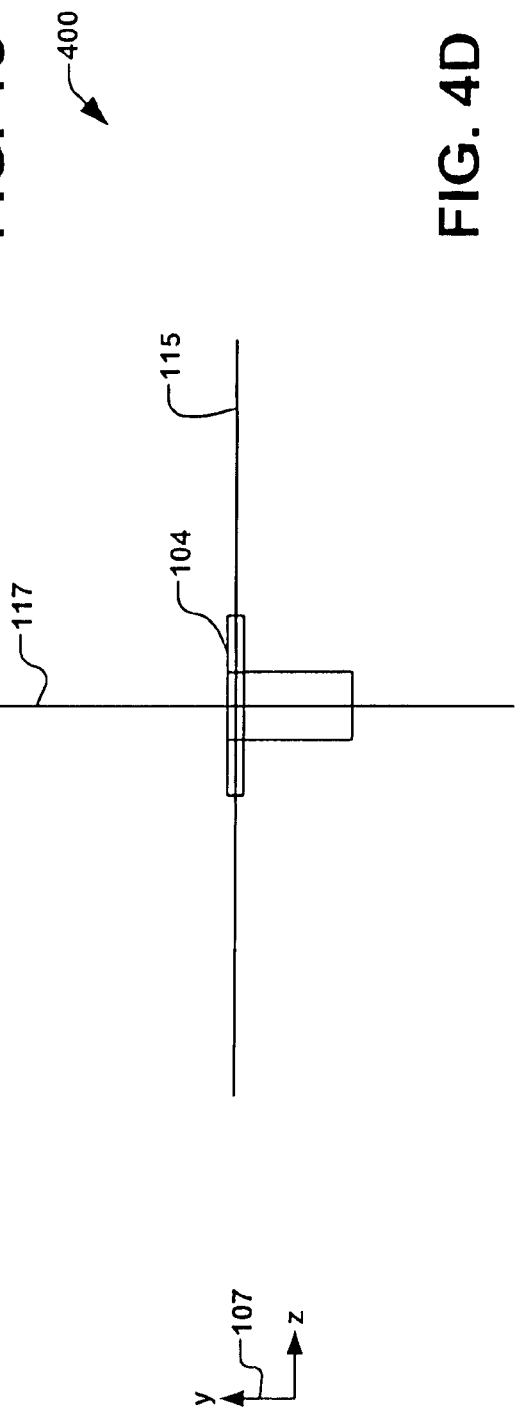
FIG. 4D is a front cross-sectional view of the exemplary ribbon ion beam illustrated in FIG. 4C according to an aspect of the invention.

The ribbon ion beam 104 exiting the mass analysis magnet 110 can be made to diverge strongly in the horizontal xz plane 115 (See e.g., FIGS. 4B, 4C and 4D). Yet the beam slightly converges in the vertical y direction 107 to form a cross over 116 at the mass selection slit 118 for mass analysis by choosing appropriate shim angles, for example, an entrance shim angle 112 and an exit shim angle 114, for the mass analysis magnet 110. Each non-zero shim angle acts like a quadrupole singlet lens of which some of the fundamental properties are to focus the beam 104 in one direction and de-focus the ion beam 104 in another direction. Alternatively, the same focusing properties can be obtained by adding an independent quadrupole singlet lens immediately after the mass analysis magnet 110, which can allow more flexibility in designing the mass analysis magnet 110. Shim angles 112 and 114 can be made to be mechanically adjustable to fine tune the divergence of the horizontal outgoing beam 104. Utilizing an independent quadrupole lens, the fine tuning of horizontal beam divergence can be accomplished, simply by changing its magnetic field.

The mass analysis magnet 110 illustrated in the embodiments of FIGS. 4A and 4B deflect ions having the desired mass and energy within the ribbon ion beam 104 approximately 30 degrees (e.g., angle δ in FIG. 4A), for example. The mass analysis magnet 110, for example, can be designed to deflect the ions through an angle δ ranging from approximately 30 to 90 degrees in the xy plane 117. The ribbon ion beam 104 has the cross over point 116 in the xy plane 117 and at an approximate center of the mass selection slit 118 of the resolving aperture 119.

The angle correction device 120 is configured to convert the horizontally divergent beam 104 out of the mass selection slit 118 into a wide parallel beam 104. It can be configured as a point to parallel focusing lens in the horizontal x direction 108, having its virtual object point 109 (FIG. 4A) where the divergent beam 104 looks like it is emanating from its focal length. In the embodiment illustrated in FIGS. 4A and 4B, the angle correction device 120 is a dipole magnet and its magnetic field 128 illustrated in gap 130 is in the vertical y direction 107 to bend the beam 104 in the xz plane 115. The angle correction device 120 can be constructed with the dipole magnet as illustrated. An electrostatic lens can be used in place of the angle correction device 120 and comprises at least one of the following: a dipole magnet, an electrostatic lens arranged as a point to parallel focusing (p-lens), a magnetic or an electrostatic quadrupole lens.

The system 100 may further comprise a deceleration module (not shown) that is controllable and selectively operable to alter an energy associated with the ribbon ion beam 104. For example, at medium energies no substantial change in ribbon beam energy may be necessary, and the module allows the ribbon ion beam 104 to pass therethrough without a substantial change thereto. Alternatively, in low energy applications (e.g., for formation of shallow junctions in a semiconductor body), the energy of the ribbon ion beam 104 may need to be decelerated. In such circumstances, the deceleration module is operable to reduce the energy of the beam 104 to a desired energy level by deceleration thereof.

Continuing with FIGS. 4A and 4B, an end station 122 is also provided in the system 100 to receive the ribbon beam 104 that has been mass analyzed and substantially decontaminated from the angle correction device 120. The end station 122 supports the one or more workpieces 124, such as semiconductor wafers situated along a third beam path 111 (however, offset from the original beamline axis due to the angle correction device 120) for implantation using the ribbon ion beam 104. Note that such an end station 122 encompasses the design of the single workpiece end station 122, as illustrated, wherein the single workpiece 124 is scanned past the ribbon ion beam 104 or the ribbon ion beam 104 is scanned across the workpiece 124. Use of a batch system, wherein multiple workpieces 124 are rotated past the ribbon ion beam 104 is also contemplated herein.

Figure 3:
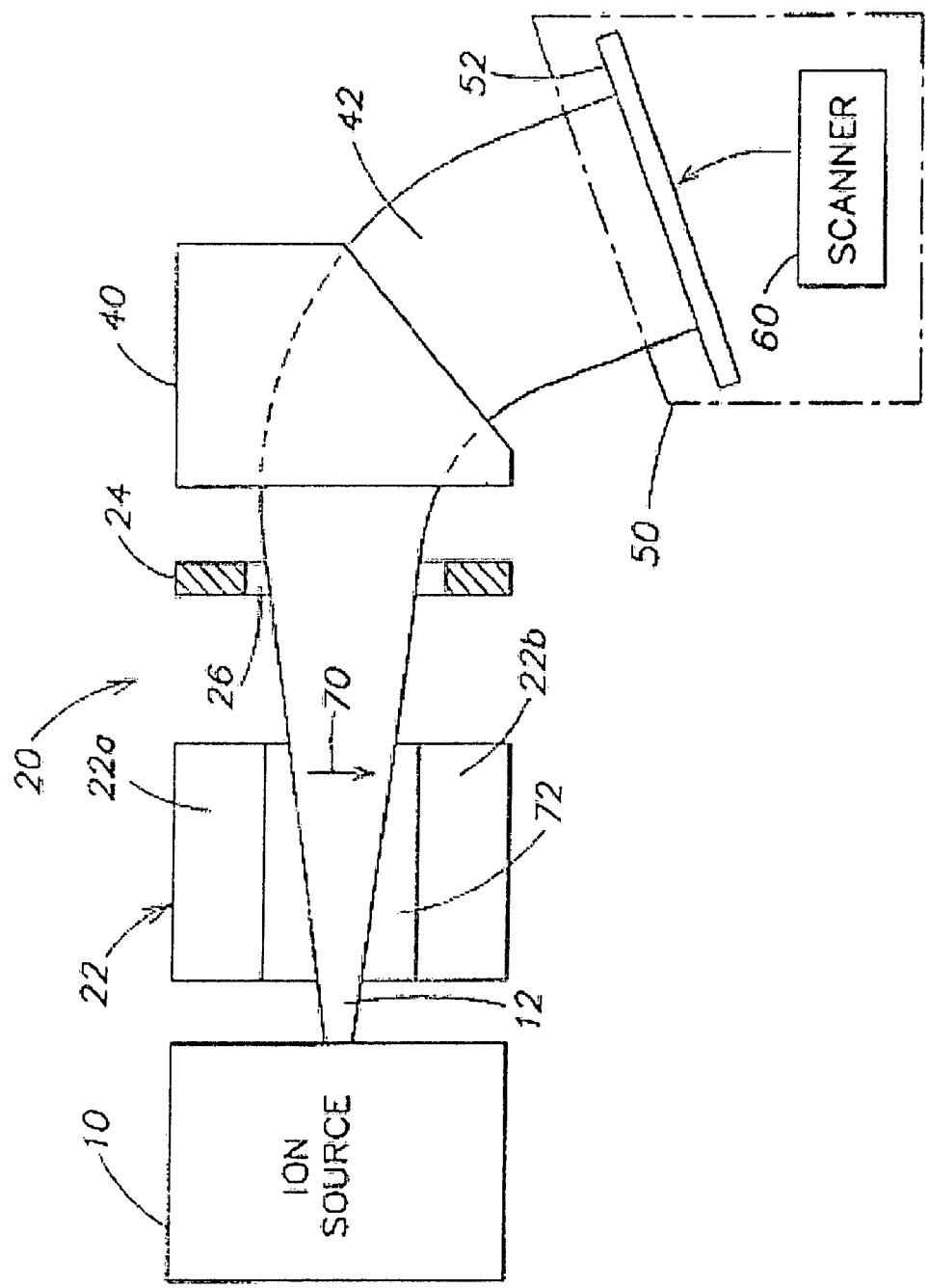
FIG. 3 is a prior art top view of an ribbon ion beam implantation apparatus.
Figure 5:
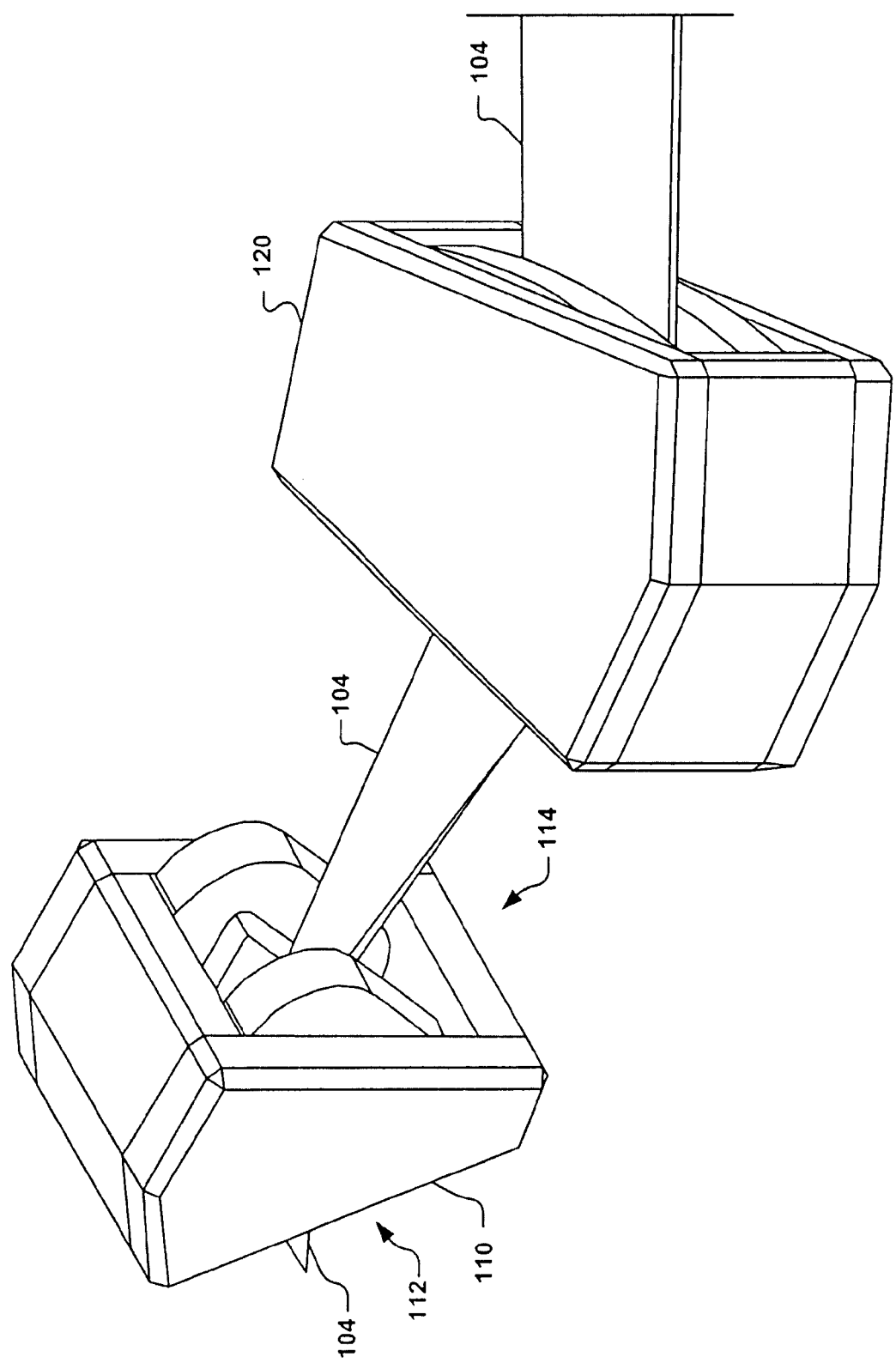
FIG. 5 is a perspective view of an exemplary ribbon ion beam implantation system according to an aspect of the present invention.
Figure 6:
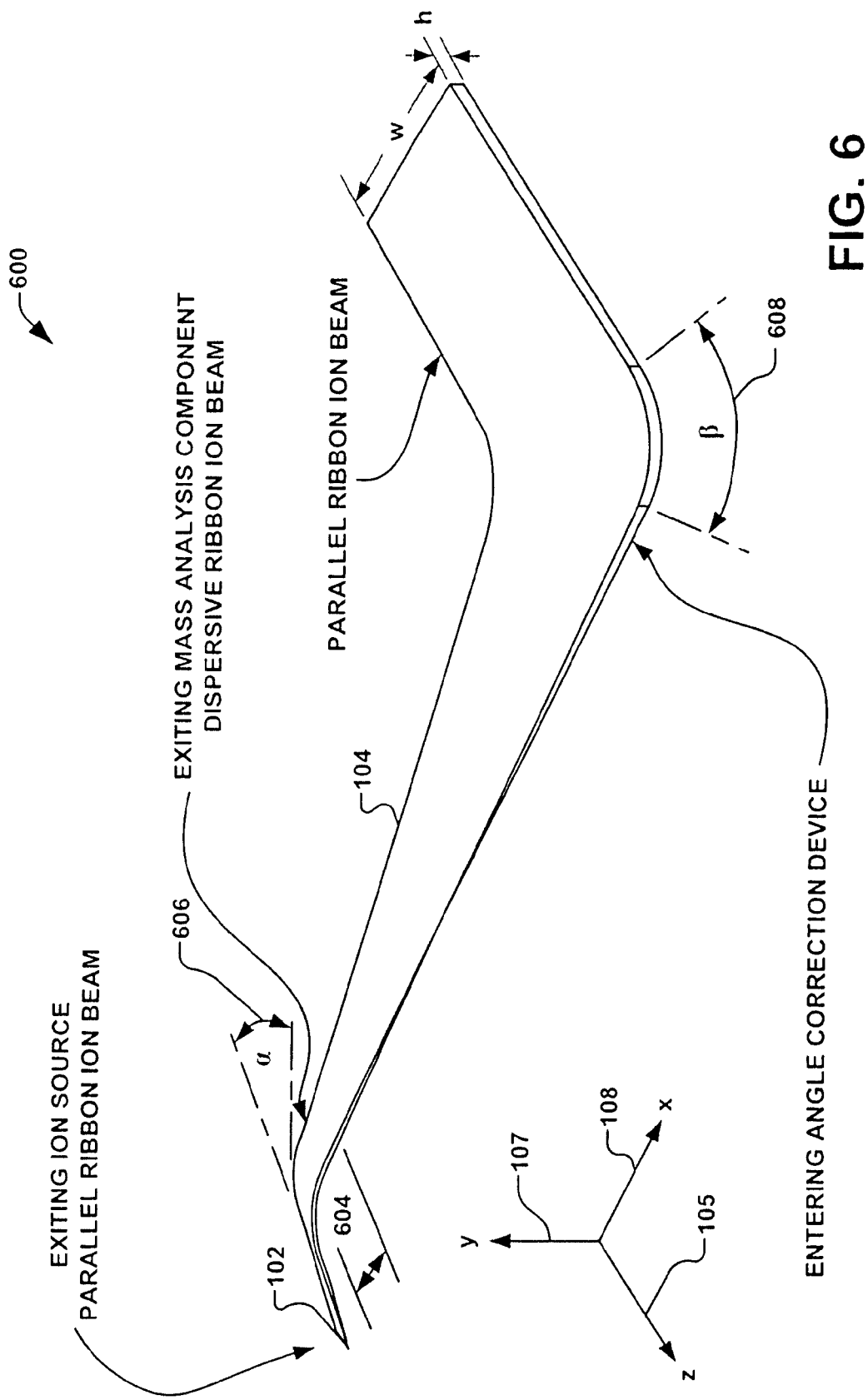
FIG. 6 is a perspective view of an exemplary ribbon ion beam according to another aspect of the present invention.

FIG. 6 illustrates a three dimensional representation of the ribbon ion beam 104 as it exits the ion source 102 (See e.g., FIGS. 4A, 4B, 4C, 4D and 5) as illustrated at location 102 (leaving the ion source) at approximately 30 degrees with respect to the vertical xy plane 117 (See e.g., FIG. 4C). The ribbon ion beam 104 exiting the ion source 102 does so in a parallel manner, as illustrated in FIGS. 4B, 4C, 4D and 6. In contrast, referring to U.S. Pat. No. 6,635,880, mentioned supra, the ribbon ion beam 12 leaves the ion source 10 as a diverging beam (See e.g., FIG. 3). In addition, referring to U.S. Pat. No. 5,126,575, also mentioned supra, the ion beam 1 is converging, clearly not parallel, as it leaves the ion source 9 (See e.g., FIG. 1).

The ribbon ion beam 104 passes through the mass analysis magnet 110, (See e.g., FIGS. 4A and 4B) as shown at approximate location 604 where the ribbon ion beam 104 can be forced to bend at an angle α 606 of approximately 30 degrees in the vertical xy plane 117 by the dipole first magnetic field. In addition, the ribbon ion beam 104 is forced to diverge in the horizontal xz plane 115 by the non-zero exit shim angle 114 (See FIG. 4A) of the mass analysis magnet 110, which acts as a quadrupole singlet lens. As stated before, an independent quadruple singlet lens can be placed immediately after the mass analysis magnet 110 to force the horizontal beam 104 to diverge, as well. The divergence of the beam 104, i.e., the location of virtual object point 109 (FIG. 4B), can be adjusted by mechanically changing the exit shim angle 114 or the magnetic field in the independent quadrupole singlet lens (not shown). The ribbon ion beam 104 exiting the mass analysis magnet 110 is dispersive in the xz plane and slightly converging in the xy plane.

A mass selection slit 118 for selecting desired ion species of the ribbon ion beam 104 exiting the mass analysis magnet 110 is utilized to block unwanted ion species and allow only the desired ion species to pass throughwith. The ribbon ion beam 104 then passes through an angle correction device 120 (FIG. 4A) that can be configured to deflect the ribbon ion beam 104 perpendicular to an xy plane 117 in the horizontal xz plane 115, as illustrated in FIG. 6. The trajectories of the selected ions within the ribbon ion beam 104 are changed from diverging to approximately parallel, as shown at angle β 608 by the action of the magnetic field of the angle correction device 120. The angle correction device 120 comprises at least one of the following: a dipole magnet, an electrostatic lens arranged as a point to parallel focusing (p-lens), and a magnetic or an electrostatic quadrupole lens.

Figure 7:
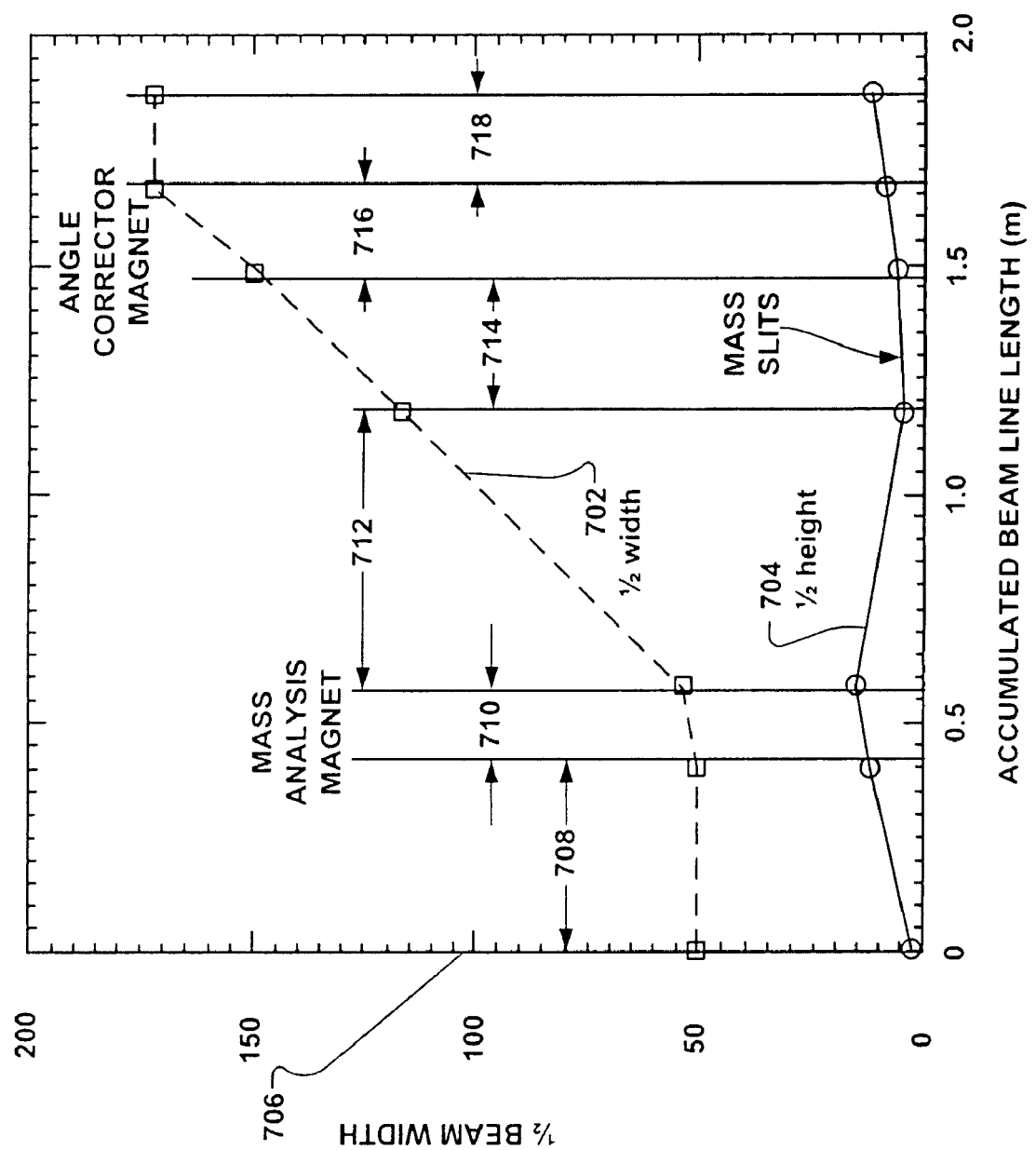
FIG. 7 is a graph illustrating a ribbon ion beam height and width as a function of distance from the ion source according to the present invention.

FIG. 7 illustrates a graphical representation of the ribbon ion beam 104 (See e.g., FIG. 6) cross sectional dimensions, height (h) and width (w), as a function of distance from the ion source 102 (See FIG. 6). A first graph 702 represents one-half of the width (w/2) of the ion ribbon beam 104, whereas a second graph 704 represents one-half of the height of the ion beam 104 (See FIG. 6). The source aperture dimensions are illustrated at the leftmost vertical axis 706 as approximately 1 mm for the vertical dimension 704 and 50 mm for the horizontal dimension 702 and therefore the ribbon ion beam 104 (FIGS. 4A and 4B) is approximately 2 mm in height and has an approximate width of 100 mm. As illustrated in the graph 704 in FIG. 7 and in the beam 104 shown in FIG. 4A, the beam 104 leaving the ion source initially diverges in height and is approximately parallel in width within region 708. The beam 104 width is made slightly divergent and slightly convergent in height within region 710 by the focusing action of a mass analysis magnet 110. This is clearly illustrated in FIGS. 4A, 4B, 4C and 4D.

The beam 104 further converges in height and diverges in width within region 712 and forms a cross over point 116 at approximately 1.2 meters downstream from the ion source 102, then proceeds through the mass selection slit 118 wherein the ion beam height diverges slightly and the ion beam width diverges, as well but to a greater degree. This can be seen in the ribbon ion beam 104, as illustrated in FIGS. 4A, 4B and 6. The ribbon ion beam 104 then enters the angle corrector magnet 120 when the ion beam 104 has reached a length of approximately 1.5 meters in length and remains in the ion corrector magnet 120 in region 716. When the ribbon ion beam 104 exits the angle corrector magnet 120 the ribbon ion beam 104 has an approximately constant width forming a parallel ribbon ion beam 104 and a slightly diverging height in region 718 prior to implantation into the wafer 124 (FIGS. 4A and 4B).

Overall in summary, in the vertical y direction 107, the beam size and angle stay rather small compared to the beam size and angle in the z direction 105. In addition, as illustrated in FIG. 4A and in the graph 704 of FIG. 7, an approximately parallel ion beam 100 mm wide (i.e., +/−50 mm from the x axis 108) leaves the ion source 102 and enters the mass analysis magnet 110 and is made strongly divergent (about ±8 degrees) by the selected defocusing property of the magnet 110 in a non-dispersive plane xz and increases its width rapidly as it travels towards the angle corrector magnet 120. The angle corrector magnet 120 converts the ±8 degree divergent ribbon ion beam 104 into a parallel ribbon ion beam 104 having approximately a ±180 mm width (i.e., 360 mm wide).

Figure 8:
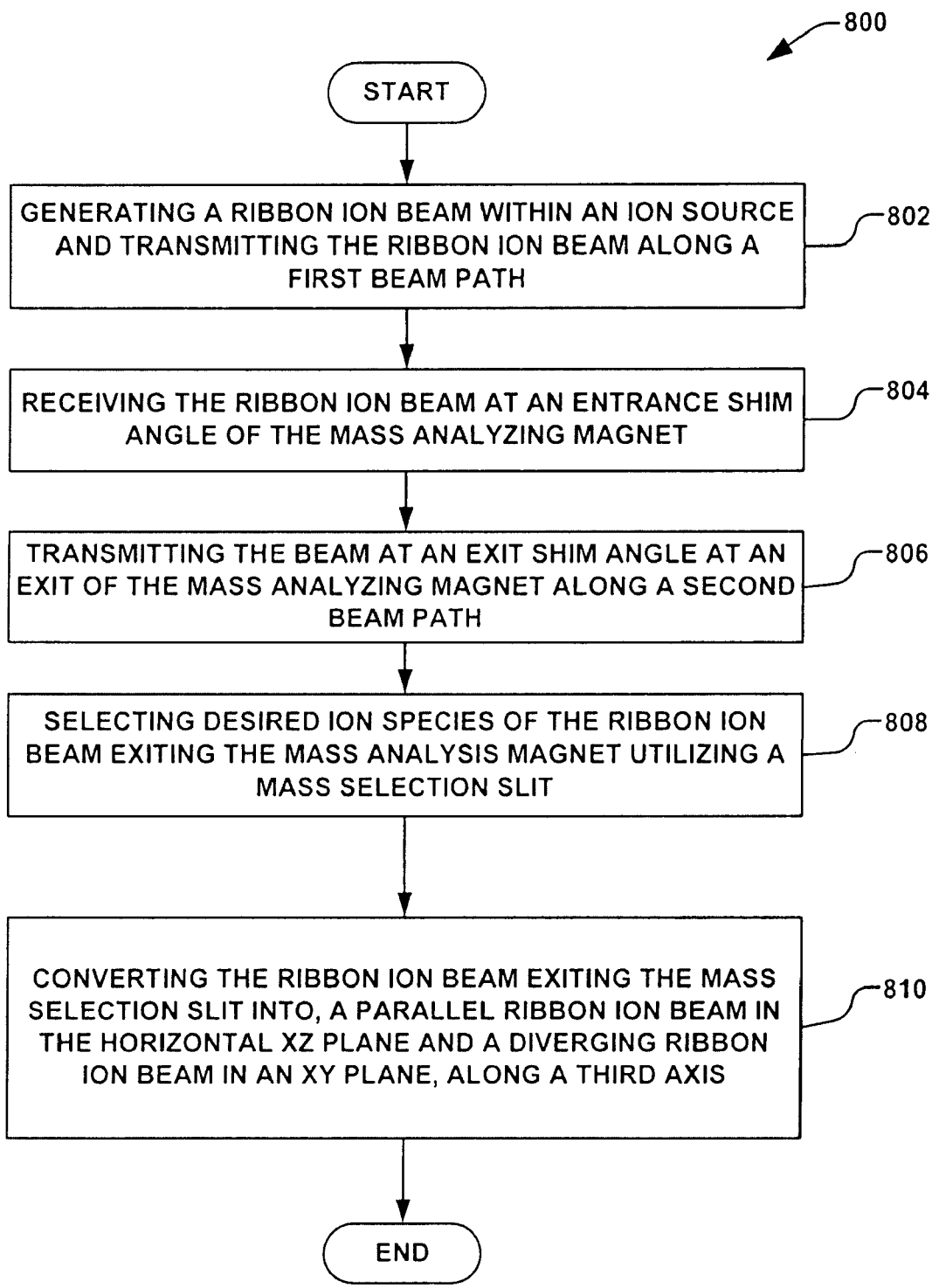
FIG. 8 is a flow chart diagram illustrating a method of mass analyzing in an ribbon ion beam implantation system according to yet another aspect of the present invention.

FIG. 8 is a flow diagram of a method 800 of creating a ribbon ion beam with high mass-energy capability for ion implantation in accordance with at least one aspect of the present invention. The method 800 can facilitate creating high beam currents at low energies for ribbon ion beam implantation. It is appreciated that the above figures and descriptions can also be referenced for the method 800.

The method 800 begins at 802 wherein parameters of an ion source are selected according to a desired ion specie, energy, current, and the like. The ion source 102 (See e.g., FIGS. 4A and 4B) can be an arc based or non arc based ion source 102, such as an RF or electron gun base ion source 102. The ion specie or species can be selected by selecting one or more source materials for the ion source 104. The current can be selected by modulating power values and/or electrodes, for example. A ribbon ion beam 104 (See e.g., FIG. 4A) is generated at 802 that translates along a first bean path 101. The source aperture dimensions, in one embodiment, are approximately 2 mm in height and 100 mm in width. As illustrated in FIGS. 4A and 4B, the beam 104 leaving the ion source initially diverges slightly in height and is approximately parallel in width prior to entering a mass analysis magnet 110 (FIG. 5). In other words, the ribbon ion beam 104 exiting the ion source 102 has a rectangular cross section with a relatively constant long dimension, width ($w_1$), for example, about 10 cm wide and a slightly divergent height (h1).

The mass analysis magnet 110 can be configured downstream of the ion source 102 for receiving the ribbon ion beam 104 therefrom. Since the initial width (w1) of the ribbon ion beam 104 is about 100 mm, which is substantially smaller than its final width (w2) for implantation (approximately 400 mm) the gap required for the mass analysis magnet 110 does not have to be exceptionally large and therefore can be constructed to have a high mass energy product, for example, enough to bend the ribbon ion beam 104 or 80 KeV ions. This is a high mass energy product that is similar to the mass energy products obtained with traditional implanters currently used. The high mass energy product of the magnet 110 allows a tight bending radius of the ribbon ion beam 104, for example, 30 cm. This allows better low energy beam transmission through the magnet 110 because of the short beam path length in the magnetic field. The high mass energy product can also reduce large power consumption which large gap analyzer magnets typically require. The strength of this dipole magnetic field is controlled by control electronics which adjusts the electrical current through field windings of the magnet 110.

Parameters of the mass analyzer magnet 110 are selected at 804 according to a charge-to-mass ratio corresponding to the selected species and a base or nominal angle. The parameters, such as current applied to coil windings, are set to yield a magnetic field that causes the selected specie to travel along a second beam path 103 (FIG. 4A) at 806 corresponding to the mass analyzer magnet 110 and exit shim angle 114.

At 808 the desired ions are selected utilizing a mass selection slit 118. Ions having different masses in the initial ion beam 104 out of the ion source 102 get bent differently by the mass analysis magnet 110 and arrive at the mass selection slit 118 at different vertical locations. By adjusting the magnetic field of the mass analysis magnet 110, only the desired ions pass through the mass selection slit 118 to go further on to the angle correction device 120. At 810 the diverging ribbon ion beam 104 in the xz plane traveling along the second beam path 103 is converted into a parallel ribbon ion beam 104 traveling along a third beam path 111.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A ribbon ion beam system, comprising:
   an ion source configured to generate a ribbon ion beam along a first beam path;
      wherein the ribbon ion beam enters a mass analysis magnet having a height dimension ($h_1$) and a long dimension ($w_1$) that is perpendicular to an xy plane;
      wherein the mass analysis magnet is configured with its momentum dispersive xy plane to receive the ribbon ion beam and to provide magnetic fields to transmit the ribbon ion beam along a second beam path;
      wherein the ribbon ion beam exiting the mass analysis magnet is divergent in a non-dispersive xz plane and convergent in the xy plane;
   a mass selection slit for receiving the divergent ribbon ion beam and selecting desired ion species of the ribbon ion beam exiting the mass analysis magnet;
   an angle correction device configured to receive the divergent ribbon ion beam exiting the mass selection slit into a parallel ribbon ion beam in the horizontal xz plane and a diverging ribbon ion beam in an xz plane along a third beam path; and
      wherein the parallel ribbon beam has a variable height ($h_2$) and a long dimension, width ($w_2$).

2. The system of claim 1, wherein an end station downstream of the angle correction device is operable to support a workpiece for implantation thereof via the parallel ribbon ion beam exiting the angle correction device.

3. The system of claim 1, wherein an entrance shim angle of the mass analysis magnet and an exit shim angle of the mass analysis magnet are arranged so that exiting beam is divergent in the non-dispersive plane and convergent in the dispersive plane.

4. The system of claim 1, wherein the entrance shim angle and the exit shim angle of the mass analysis magnet is configured to be adjustable by mechanically adjusting the entrance shim angle and the exit shim angle of the mass analysis magnet so that the divergence of the ribbon ion beam in the xz plane is adjustable, so that the parallel ribbon beam exiting the angle correction component has the desired width ($w_2$).

5. The system of claim 1, wherein a quadrupole singlet lens is configured immediately after the mass analysis magnet so that the divergence of the ribbon ion beam exiting the mass analysis magnet is adjustable in the xz plane.

6. The system of claim 1, wherein the angle correction device comprises at least one of the following: an angle corrector magnet, an electrostatic lens arranged for point to parallel focusing (p-lens), and a magnetic and an electrostatic quadrupole lens assembly.

7. The system of claim 1, wherein the mass analysis magnet deflects ions of the ribbon ion beam entering the mass analysis magnet by an angle in the range of approximately 30 to 90 degrees in the xy plane.

8. The system of claim 1, wherein the ribbon ion beam crosses over in the xy plane and a cross over point occurs at an approximate center location of the mass selection slit.

9. A method of producing a ribbon ion beam, comprising:
   generating the ribbon ion beam utilizing an ion source, wherein the ribbon ion beam is directed along a first beam path;
   receiving the ribbon ion beam having a beam cross-section with a height dimension ($h_1$) and with a long dimension ($w_1$) that is perpendicular to an xy plane at an entrance shim angle of the mass analysis magnet;
   transmitting the ribbon ion beam at an exit shim angle along a second beam path wherein the ribbon ion beam exiting the mass analysis magnet is dispersing in an xz plane and converging in the xy plane;
   selecting desired ion species of the ribbon ion beam exiting the mass analysis magnet utilizing a mass selection slit; and
   converting the ribbon ion beam exiting the mass selection slit into a parallel ribbon ion beam in the xz plane and a diverging ribbon ion beam in an xy plane along a third axis utilizing an angle correction device and wherein the parallel ribbon ion beam has a height ($h_2$) and a long dimension, width ($w_2$).

10. The method of claim 9, wherein the angle correction device comprises at least one of the following: a dipole magnet, an electrostatic lens arranged for point to parallel focusing (p-lens), an electrostatic lens arranged for point to parallel focusing (p-lens).

11. The method of claim 9, wherein a focus adjustment device is positioned in the ribbon ion beam path just after the mass analysis magnet wherein, the focus adjustment device comprises a quadruple lens, wherein the quadruple lens is configured with variable focus to adjust the ion trajectories of the selected ion species.

12. The method of claim 9, wherein an end station downstream of the angle correction device is operable to support a workpiece for implantation thereof via the parallel ribbon ion beam exiting the angle correction device.

13. The method of claim 9, wherein the divergence of the ribbon ion beam in xz plane is configured to be adjustable by mechanically adjusting the entrance shim angle and the exit shim angle of the mass analysis magnet, so that the parallel ribbon beam exiting the angle correction component can be adjusted in width ($w_2$).

14. The method of claim 9, wherein a quadrupole singlet lens is configured immediately after the mass analysis magnet so that the divergence of the beam in the xz plane is adjustable.

15. The method of claim 9, wherein the angle correction device comprises at least one of the following: an angle corrector magnet, an electrostatic lens arranged for point to parallel focusing (p-lens), a magnetic and an electrostatic quadrupole lens assembly.

16. The method of claim 9, wherein the mass analysis magnet deflects ions of the ribbon ion beam by an angle in the range of approximately 30 to 90 degrees in the xy plane.

17. The method of claim 9, wherein the ribbon ion beam crosses over in the xy plane and the cross over point occurs at an approximate center location of the mass selection slit.

18. The method of claim 9, wherein the angle correction device comprises at least one of the following: a dipole magnet, an electrostatic lens arranged for point to parallel focusing (p-lens) and an electrostatic lens arranged for point to parallel focusing (p-lens).

19. A ribbon ion beam implant system for controllably treating a workpiece comprising:
(a) source means for generating a ribbon ion beam with a beam cross-sectional center directed along a first beam path;
(b) mass analysis means to mass analyze the ribbon ion beam entering the mass analysis magnet having a cross section with a variable height dimension ($h_1$) and with a long dimension ($w_1$) that is constant and perpendicular to an xy plane;
(c) receiving means for receiving the ribbon ion beam at an entrance shim angle;
(d) transmitting means for transmitting on the diverging ribbon ion beam along the xz plane at an exit shim angle and along a second beam path;
(e) selecting means for choosing desired ion species of the diverging ribbon ion beam along the xz plane utilizing a mass selection slit; and
(f) converting means for changing diverging ribbon ion beam along the xz plane into a parallel ribbon beam along the xz plane traveling along a third beam path utilizing an angle correction device.

20. A system according to claim 19, wherein the cross section generated by the source has a height (h1) and a long dimension (w1) that is constant; an end station downstream of the angle correction device is operable to support a workpiece for implantation thereof via the parallel ribbon ion beam exiting the angle correction device.

21. The system according to claim 19, wherein the angle correction device comprises at least one of the following: an angle corrector magnet, an electrostatic lens arranged for point to parallel focusing (p-lens), a magnetic and an electrostatic quadrupole lens assembly.

22. The system according to claim 19, wherein a quadrupole singlet lens is configured immediately after the mass analysis magnet so that the divergence of the beam in the xz plane is adjustable.

23. The system according to claim 19, wherein the angle correction device comprises at least one of the following: an angle corrector magnet, an electrostatic lens arranged for point to parallel focusing (p-lens), a magnetic and an electrostatic quadrupole lens assembly.

24. The system according to claim 19, wherein the mass analysis magnet deflects ions of the ribbon ion beam by an angle in the range of approximately 30 to 90 degrees in the xy plane.

25. The system according to claim 19, wherein the ribbon ion beam crosses over in the xy plane and the cross over point occurs at an approximate center location of the mass selection slit.

* * * * *